US006876265B2

(12) United States Patent
Nantz et al.

(10) Patent No.: US 6,876,265 B2
(45) Date of Patent: Apr. 5, 2005

(54) SYSTEM AND METHOD FOR USING A SAW BASED RF TRANSMITTER FOR AM MODULATED TRANSMISSION IN A TPM

(75) Inventors: John S. Nantz, Brighton, MI (US); Qingfeng Tang, Novi, MI (US); Ronald O. King, Brownstown, MI (US); Riad Ghabra, Dearborn Heights, MI (US)

(73) Assignee: Lear Corporation, Southfield, MI (US)

( * ) Notice: Subject to any disclaimer, the term of this patent is extended or adjusted under 35 U.S.C. 154(b) by 186 days.

(21) Appl. No.: 10/322,004

(22) Filed: Dec. 17, 2002

(65) Prior Publication Data

US 2003/0164741 A1 Sep. 4, 2003

Related U.S. Application Data

(60) Provisional application No. 60/360,762, filed on Mar. 1, 2002.

(51) Int. Cl.[7] ................................................ H04Q 1/00
(52) U.S. Cl. .................... 331/107 R; 332/149; 340/442
(58) Field of Search ...................... 331/107 R; 455/109, 455/108; 340/442, 447; 332/149, 176

(56) References Cited

U.S. PATENT DOCUMENTS

| 3,580,353 A | 5/1971 | Thompson .................. 180/167 |
| 3,723,966 A | 3/1973 | Mueller et al. |

(Continued)

FOREIGN PATENT DOCUMENTS

| DE | 4232240 A | 3/1994 |
| EP | 0 016 991 A | 10/1980 |
| EP | 0671289 A1 | 12/1994 |
| EP | 0 646 985 A1 | 4/1995 |
| EP | 0 753 897 A2 | 1/1997 |
| EP | 0 760 299 A1 | 3/1997 |
| EP | 0995619 A1 | 4/2000 |
| EP | 1059177 | 12/2000 |
| EP | 1 113 582 A2 | 7/2001 |
| EP | 1 172 236 | 1/2002 |
| EP | 1 211 104 A2 | 6/2002 |
| EP | 1 215 056 A2 | 6/2002 |
| EP | 1215056 A3 | 6/2002 |
| EP | 1 262 339 A1 | 12/2002 |
| EP | 1 267 021 A1 | 12/2002 |
| FR | 2801728 A | 6/2001 |
| GB | 1483735 | 8/1977 |
| GB | 2179480 A | 3/1987 |
| GB | 2318696 A | 4/1998 |
| GB | 2363463 A | 12/2001 |
| GB | 2381972 A | 5/2003 |
| JP | 260212 A1 | 2/1990 |
| JP | 10-107548 A | 4/1998 |
| JP | 2001-007712 A | 1/2001 |
| WO | WO 91/08614 | 6/1991 |
| WO | WO 96/15919 A1 | 5/1996 |

(Continued)

OTHER PUBLICATIONS

William Schweber, Electronic Communication Systems, 1991, Prentice–Hall, Inc., pp. 91–93.*

Primary Examiner—Robert Pascal
Assistant Examiner—Joseph Chang
(74) Attorney, Agent, or Firm—Bill C. Panagos

(57) ABSTRACT

For use in a tire pressure monitoring system, an amplitude modulation (AM) radio frequency (RF) oscillator includes a modulator and a generator. The modulator may be configured to generate a modulation signal in response to a data input signal. The generator may be configured to generate an AM output signal having an RF carrier frequency and an envelope, wherein the envelope is amplitude modulated by the modulation signal and the generator includes a frequency determining device.

15 Claims, 1 Drawing Sheet

U.S. PATENT DOCUMENTS

| | | | |
|---|---|---|---|
| 3,916,688 A | 11/1975 | Dendy et al. ............. | 73/178 T |
| 4,067,235 A | 1/1978 | Markland et al. .......... | 73/146.5 |
| 4,101,870 A | 7/1978 | Ekman ....................... | 340/459 |
| 4,330,774 A | 5/1982 | Doty .......................... | 340/445 |
| 4,450,431 A | 5/1984 | Hochstein .................. | 340/447 |
| 4,468,650 A | 8/1984 | Barbee ....................... | 346/58 |
| 4,570,152 A | 2/1986 | Melton et al. .............. | 340/449 |
| 4,609,905 A | 9/1986 | Uzzo | |
| 4,646,359 A * | 2/1987 | Furrer ........................ | 455/108 |
| 4,660,528 A | 4/1987 | Buck .......................... | 123/333 |
| 4,670,845 A | 6/1987 | Etoh .......................... | 701/301 |
| 4,684,853 A | 8/1987 | Coash | |
| 4,717,905 A | 1/1988 | Morrison, Jr. et al. ...... | 340/447 |
| 4,749,993 A | 6/1988 | Szabo et al. ........... | 340/870.31 |
| 4,761,830 A | 8/1988 | Izumi | |
| 4,896,372 A * | 1/1990 | Weaver ...................... | 455/108 |
| 4,951,208 A | 8/1990 | Etoh .......................... | 701/97 |
| 5,040,561 A | 8/1991 | Achterholt ................. | 137/227 |
| 5,109,213 A | 4/1992 | Williams .................... | 340/447 |
| 5,156,230 A | 10/1992 | Washburn .................. | 180/170 |
| 5,165,497 A | 11/1992 | Chi ............................ | 180/169 |
| 5,289,160 A | 2/1994 | Fiorletta .................... | 340/447 |
| 5,444,448 A | 8/1995 | Schuermann et al. ........ | 342/42 |
| 5,451,959 A | 9/1995 | Schuermann ................ | 342/51 |
| 5,461,385 A | 10/1995 | Armstrong .................. | 342/42 |
| 5,463,374 A | 10/1995 | Mendez et al. ............. | 340/442 |
| 5,473,938 A | 12/1995 | Handfield et al. ........ | 73/146.5 |
| 5,479,171 A | 12/1995 | Schuermann ............ | 340/10.41 |
| 5,483,827 A | 1/1996 | Kulka et al. ................. | 73/706 |
| 5,485,381 A | 1/1996 | Heintz et al. ................ | 701/93 |
| 5,500,637 A | 3/1996 | Kokubu ..................... | 340/447 |
| 5,515,014 A | 5/1996 | Troutman | |
| 5,531,109 A | 7/1996 | Tsagas ....................... | 73/146.5 |
| 5,562,787 A | 10/1996 | Koch et al. .................. | 156/64 |
| 5,573,610 A | 11/1996 | Koch et al. ............. | 152/152.1 |
| 5,573,611 A | 11/1996 | Koch et al. ............. | 152/152.1 |
| 5,585,554 A | 12/1996 | Handfield et al. ........ | 73/146.5 |
| 5,600,301 A | 2/1997 | Robinson, III ............. | 340/442 |
| 5,602,524 A | 2/1997 | Mock et al. ................ | 340/447 |
| 5,612,671 A | 3/1997 | Mendez et al. | |
| 5,654,689 A | 8/1997 | Peyre et al. ........... | 340/426.11 |
| 5,661,651 A | 8/1997 | Geschke et al. ............. | 701/88 |
| 5,677,667 A | 10/1997 | Lesesky et al. ............. | 340/431 |
| 5,705,746 A | 1/1998 | Trost et al. .................. | 73/146 |
| 5,708,403 A | 1/1998 | Morozumi et al. | |
| 5,717,376 A | 2/1998 | Wilson ....................... | 340/442 |
| 5,724,028 A | 3/1998 | Prokup ....................... | 701/36 |
| 5,728,933 A | 3/1998 | Schultz et al. ............. | 73/146.5 |
| 5,740,548 A | 4/1998 | Hudgens ..................... | 701/35 |
| 5,741,966 A | 4/1998 | Handfield et al. ........ | 73/146.5 |
| 5,753,809 A | 5/1998 | Ogusu et al. ............... | 73/146.2 |
| 5,760,682 A | 6/1998 | Liu et al. ..................... | 340/444 |
| 5,774,047 A | 6/1998 | Hensel, IV ................. | 340/442 |
| 5,783,992 A | 7/1998 | Eberwine et al. ........... | 340/445 |
| 5,822,683 A | 10/1998 | Paschen ................. | 340/10.34 |
| 5,835,868 A | 11/1998 | McElroy et al. .............. | 701/2 |
| 5,838,229 A | 11/1998 | Robinson, III ............. | 340/442 |
| 5,844,130 A | 12/1998 | Hilgart et al. ............. | 73/146.5 |
| 5,853,020 A | 12/1998 | Widner ....................... | 137/227 |
| 5,880,363 A | 3/1999 | Meyer et al. .............. | 73/146.5 |
| 5,883,305 A | 3/1999 | Jo et al. | |
| 5,900,808 A | 5/1999 | Lebo .......................... | 340/442 |
| 5,920,234 A | 7/1999 | Hill | |
| 5,926,087 A | 7/1999 | Busch et al. ................ | 340/438 |
| 5,929,620 A | 7/1999 | Dobkin et al. .............. | 323/288 |
| 5,939,977 A | 8/1999 | Monson ..................... | 340/442 |
| 5,942,971 A | 8/1999 | Fauci et al. ................. | 340/442 |
| 5,959,365 A | 9/1999 | Mantini et al. ............ | 307/10.1 |
| 5,963,128 A | 10/1999 | McClelland ................ | 340/447 |
| 5,999,091 A | 12/1999 | Wortham ................... | 340/431 |
| 6,002,327 A | 12/1999 | Boesch et al. ............. | 340/442 |
| 6,025,777 A | 2/2000 | Fuller et al. ................ | 340/442 |
| 6,034,596 A | 3/2000 | Smith et al. ................ | 340/447 |
| 6,034,597 A | 3/2000 | Normann et al. .......... | 340/447 |
| 6,043,738 A | 3/2000 | Stewart et al. ............. | 340/442 |
| 6,043,752 A | 3/2000 | Hisada et al. ............. | 340/5.26 |
| 6,053,038 A | 4/2000 | Schramm et al. ......... | 73/146.5 |
| 6,060,984 A | 5/2000 | Braun et al. ................ | 340/442 |
| 6,078,226 A | 6/2000 | Ajjikuttira | |
| 6,087,930 A | 7/2000 | Kulka et al. ................ | 340/447 |
| 6,111,520 A | 8/2000 | Allen et al. ................. | 340/447 |
| 6,112,587 A | 9/2000 | Oldenettel ................ | 73/146.5 |
| 6,118,369 A | 9/2000 | Boesch ...................... | 340/443 |
| 6,127,939 A | 10/2000 | Lesesky et al. ............. | 340/438 |
| 6,169,480 B1 | 1/2001 | Uhl et al. .................... | 340/442 |
| 6,175,302 B1 | 1/2001 | Huang ........................ | 340/442 |
| 6,181,241 B1 | 1/2001 | Normann et al. .......... | 340/447 |
| 6,204,758 B1 | 3/2001 | Wacker et al. ............. | 340/444 |
| 6,232,875 B1 | 5/2001 | DeZorzi ..................... | 340/442 |
| 6,232,884 B1 | 5/2001 | Gabbard ............... | 340/825.72 |
| 6,239,753 B1 | 5/2001 | Kado et al. | |
| 6,243,007 B1 | 6/2001 | McLaughlin et al. ....... | 340/447 |
| 6,246,317 B1 | 6/2001 | Pickornik et al. .......... | 340/447 |
| 6,252,498 B1 | 6/2001 | Pashayan, Jr. ............. | 340/447 |
| 6,255,940 B1 | 7/2001 | Phelan et al. ............... | 340/447 |
| 6,259,361 B1 | 7/2001 | Robillard et al. .......... | 340/447 |
| 6,259,362 B1 | 7/2001 | Lin ............................ | 340/457 |
| 6,275,148 B1 | 8/2001 | Takamura et al. ......... | 340/447 |
| 6,278,363 B1 | 8/2001 | Bezek et al. ................ | 340/442 |
| 6,292,095 B1 | 9/2001 | Fuller et al. | |
| 6,304,610 B1 | 10/2001 | Monson ..................... | 375/259 |
| 6,340,929 B1 | 1/2002 | Katou et al. ................ | 340/447 |
| 6,362,731 B1 | 3/2002 | Lill | |
| 6,369,703 B1 | 4/2002 | Lill | |
| 6,384,720 B1 | 5/2002 | Juzswik et al. | |
| 6,408,690 B1 | 6/2002 | Young et al. .............. | 73/146.5 |
| 6,417,766 B1 | 7/2002 | Starkey ...................... | 340/447 |
| 6,441,728 B1 | 8/2002 | Dixit et al. | |
| 6,489,888 B1 | 12/2002 | Honeck et al. | |
| 6,501,372 B2 | 12/2002 | Lin ............................ | 340/442 |
| 6,518,877 B1 | 2/2003 | Starkey et al. ............. | 340/447 |
| 6,543,279 B1 | 4/2003 | Yones et al. ............... | 73/146.5 |
| 6,571,617 B2 | 6/2003 | Van Nickerk et al. | |
| 6,581,449 B1 | 6/2003 | Brown et al. | |
| 6,612,165 B2 | 9/2003 | Juzswik et al. | |
| 2001/0008083 A1 | 7/2001 | Brown ....................... | 73/146 |
| 2003/0020605 A1 | 1/2003 | Starkey | |
| 2003/0201879 A1 | 10/2003 | Munch et al. .............. | 340/442 |

FOREIGN PATENT DOCUMENTS

| | | |
|---|---|---|
| WO | WO 98/26946 | 6/1998 |
| WO | WO 99/29523 A1 | 6/1999 |
| WO | WO 01/26069 A1 | 4/2001 |
| WO | WO 01/69803 | 9/2001 |
| WO | WO 01/76007 A1 | 10/2001 |
| WO | WO 01/81104 A1 | 11/2001 |
| WO | WO 02/057097 | 7/2002 |
| WO | WO 02/072369 A1 | 9/2002 |

* cited by examiner

SYSTEM AND METHOD FOR USING A SAW BASED RF TRANSMITTER FOR AM MODULATED TRANSMISSION IN A TPM

CROSS-REFERENCE TO RELATED APPLICATION

This application claims the benefit of U.S. provisional application Ser. No. 60/360,762 filed Mar. 1, 2002.

BACKGROUND OF THE INVENTION

1. Field of the Invention

The present invention relates to a system and a method for using a surface acoustic wave (SAW) based radio frequency (RF) transmitter for amplitude modulation RF transmission in a tire pressure monitoring (TPM) system.

2. Background Art

It is known in the automotive industry to provide for wireless monitoring of vehicle tire parameters, particularly tire pressure. In some such tire pressure monitoring (TPM) systems, tire pressure sensors and radio frequency (RF) transmitters that can generate and transmit at least one amplitude modulated (AM) signal. In each tire, the tire pressure sensed by the tire pressure sensor is transmitted by the transmitter through an antenna to a receiver/controller located on the vehicle. The tire pressure information delivered to the receiver/controller by the RF AM signals from the transmitters is subsequently conveyed to a vehicle operator or occupant, typically using a display unit. In such a fashion, tire pressure monitoring systems can help to improve vehicle safety. Exemplary tire pressure monitoring systems are described and shown in U.S. Pat. Nos. 6,112,587 and 6,034,597.

Remote keyless entry (RKE) systems are also well known in the automotive industry. Some RKE systems can include a conventional RF AM transmitter used by the vehicle operator or occupant to transmit signals that control such functions as door, trunk, etc. locking/unlocking, turning on/off lights, sounding an alert, arming/disarming an anti-theft system, etc. and a receiver/controller in the vehicle that processes the transmitter control signals.

However, conventional AM transmitters that are not based on surface acoustic wave (SAW) technology (i.e., non-SAW AM transmitters) are limited to transmission of lower data rates than is desired for some tire pressure monitoring and RKE applications. Furthermore, some conventional SAW based AM transmitters have two or more transistors to generate the amplitude modulation. As a result, conventional SAW based AM transmitters are costly and can have significant circuit board size and weight. Yet further, many conventional tire pressure monitoring and RKE AM oscillator implementations are configured as on-off keyed (OOK) devices (i.e., devices only having two fixed percentages, usually 0% and 100%) AM capability.

Thus, there exists a need for a system and a method for a SAW based RF transmitter to provide AM signal modulation generation in a single transistor configuration. Such a system and method would generally provide fewer components and hence be less costly than conventional approaches. Such a system and method would generally provide the desired data rates for applications such as TPM and RKE applications. Such a system and method is generally adjustable for any desired value (or percentage) of AM capability as compared with many conventional AM oscillators that only implement OOK modulation.

SUMMARY OF THE INVENTION

Accordingly, the present invention provides an improved system and an improved method for a surface acoustic wave (SAW) based radio frequency (RF) transmitter to provide amplitude modulation (AM) signal modulation generation in a single transistor configuration. The present invention may be advantageously implemented in connection with a tire pressure monitoring (TPM) system, a remote keyless entry (RKE) system, or the like.

According to the present invention, for use in a tire pressure monitoring system, an amplitude modulation (AM) radio frequency (RF) oscillator is provided comprising a modulator and a generator. The modulator may be configured to generate a modulation signal in response to a data input signal. The generator may be configured to generate an AM output signal having an RF carrier frequency and an envelope, wherein the envelope is amplitude modulated by the modulation signal and the generator comprises a frequency determining device.

Also according to the present invention, for use in a tire pressure monitoring system, a method of generating an amplitude modulation (AM) radio frequency (RF) output signal is provided, the method comprising generating a modulation signal in response to a data input signal, generating an AM output signal having an RF carrier frequency and an envelope, and amplitude modulating the envelope of the output signal with the modulation signal, wherein the output signal is generated using a generator comprising a frequency determining device.

Further, according to the present invention, for use in a remote keyless entry (RKE) system, an amplitude modulation (AM) radio frequency (RF) oscillator is provided comprising a modulator and a generator. The modulator may be configured to generate a modulation signal in response to a data input signal. The generator may be configured to generate an AM output signal having an RF carrier frequency and an envelope, wherein the envelope is amplitude modulated by the modulation and the generator comprises a surface acoustic wave (SAW) device.

The above features, and other features and advantages of the present invention are readily apparent from the following detailed descriptions thereof when taken in connection with the accompanying drawings.

DETAILED DESCRIPTION OF THE PREFERRED EMBODIMENT(S)

With reference to the Figures, the preferred embodiments of the present invention will now be described in detail. As previously noted, it is known in the automotive industry to provide for wireless monitoring of vehicle tire parameters, particularly tire pressure. In some such tire pressure monitoring (TPM) systems, tire pressure sensors and radio frequency (RF) transmitters that can generate and transmit at least one amplitude modulated (AM) signal. In each tire, the tire pressure sensed by the tire pressure sensor is transmitted by the transmitter through an antenna to a receiver/controller located on the vehicle. The tire pressure information delivered to the receiver/controller by the RF AM signals from the transmitters is subsequently conveyed to a vehicle operator or occupant, typically using a display unit. In such a fashion, tire pressure monitoring systems can help to improve vehicle safety.

Remote keyless entry (RKE) systems are also well known in the automotive industry. Some RKE systems can include a conventional RF AM transmitter used by the vehicle operator or occupant to transmit signals that control such functions as door, trunk, etc. locking/unlocking, turning on/off lights, sounding an alert, arming/disarming an anti-theft system, etc. and a receiver/controller in the vehicle that processes the transmitter control signals.

Generally, the present invention provides an improved system and method for producing (or generating) an AM RF signal using a surface acoustic wave (SAW) based transmitter oscillator. The present invention may accommodate high data rates in connection with a single transistor AM transmitter. Such a system and method are generally implemented having fewer components and may be less costly than conventional approaches. Such a system and method generally provide the desired data rates that may not be attainable using conventional approaches for applications such as TPM and RKE systems. The amplitude modulation generated by the present invention may be adjustable for any desired value of AM, whereas many conventional approaches to generation of AM RF signals are limited to OOK modulation.

Figure 1:
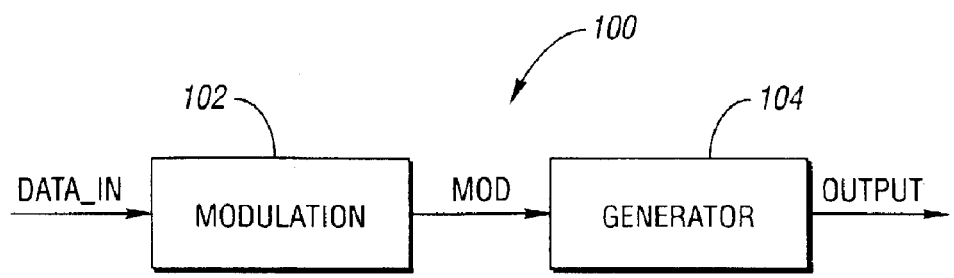
FIG. 1 is a diagram of an amplitude modulation oscillator according to the present invention.

Referring to FIG. 1, a diagram illustrating a oscillator circuit 100 in accordance with a preferred embodiment of the present invention is shown. The oscillator 100 is generally implemented as a surface acoustic wave (SAW) modulation circuit that is configured to provide an amplitude modulation (AM) signal (e.g., MOD) to an RF output signal having an RF carrier frequency and an envelope in response to a data input signal (e.g., DATA_IN) and, thereby, generate an amplitude modulated RF output signal (e.g., OUTPUT). The oscillator 100 generally comprises a modulation circuit (or modulator) 102 that is configured to provide the amplitude modulation signal MOD for modulation of an envelope of a signal generated by an RF surface acoustic wave (SAW) based frequency generation circuit (or generator) 104 in response to the data input signal DATA_IN and, thereby, generate the amplitude modulated RF output signal OUTPUT. In one example, the oscillator 100 may be implemented in connection with a TPM system. In another example, the oscillator 100 may be implemented in connection with a RKE system. However, the oscillator 100 may be advantageously implemented in connection with any appropriate wireless transmission system to meet the design criteria of a particular application.

The modulator 102 may have an input that may receive the signal DATA_IN and an output that may present the signal MOD. The RF generator 104 may have an input that may receive the signal MOD and an output that may present the signal OUTPUT. In one example, the generator 104 may be configured as a Colpitts oscillator. However, the generator 104 may be implemented (or configured) as any appropriate RF oscillator to meet the design criteria of a particular application.

The signal DATA_IN is generally data (or information) that is modulated onto an envelope of a carrier wave having a radio frequency (RF). The signal OUTPUT is generally an AM RF signal where the amplitude modulation corresponds to the signal (or information related to the signal) DATA_IN. The circuit 100 may be configured to generate the signal OUTPUT in response to the signal DATA_IN. The signal OUTPUT is generally coupled to an amplifier, antenna, load, or other appropriate component or circuitry (not shown) to meet the design criteria of a particular application.

Figure 2:
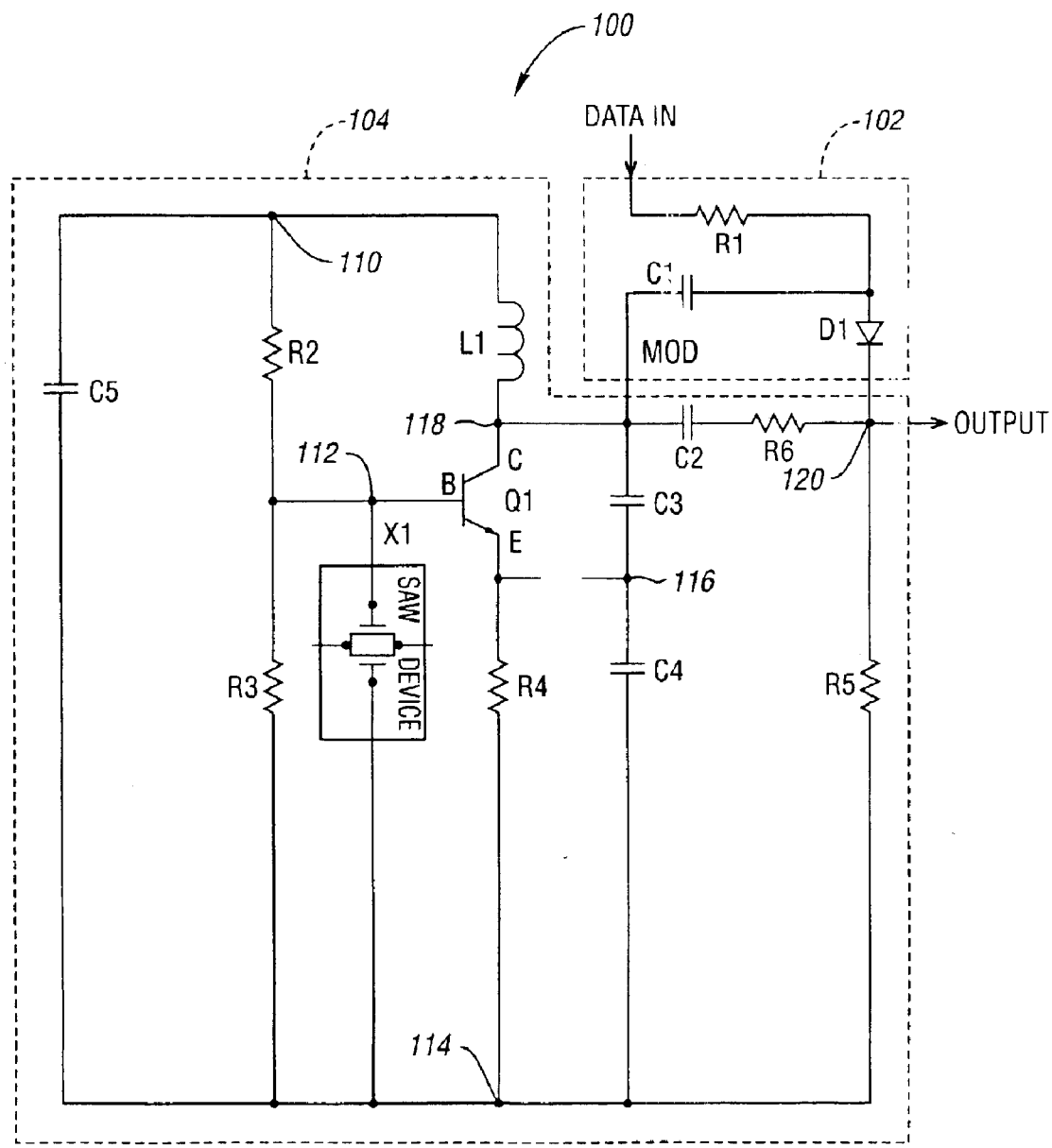
FIG. 2 is a detailed diagram of the oscillator of FIG. 1.

Referring to FIG. 2, a detailed diagram of the oscillator 100 is shown. The oscillator 100 generally comprises resistances (or resistors) R1, R2, R3, R4, R5 and R6, capacitances C1, C2, C3, C4 and C5, a diode D1, an element (or device) X1, an inductance L1, and a device (or transistor) Q1. Some components of the oscillator 100 are generally connected to form a number of nodes (e.g., nodes 110, 112, 114, 116, 118, and 120) as described below.

In one example, the capacitances C1–C5 may be implemented as capacitors. In another example, the capacitances C1–C5 may be implemented as transistors configured as capacitors. However, the capacitances C1–C5 may be implemented as any appropriate capacitive components to meet the design criteria of a particular application. In one example, the diode D1 may be implemented as a bi-polar component. In another example, the diode D1 may be implemented as at least one transistor configured as a diode.

The element X1 is generally implemented as a surface acoustic wave (SAW) device that is configured to have a predetermined (e.g., set, fixed, stable, etc.) oscillation frequency in response to a given input (e.g., a particular input current or voltage). However, the element X1 may be implemented as any appropriate frequency determining device, network, circuitry, etc. (e.g., LC components, a crystal resonator, a ceramic resonator, etc.) to meet the design criteria of a particular application. The transistor Q1 is generally implemented as a bipolar junction transistor (BJT). However, the device Q1 may be implemented as any appropriate device (e.g., an FET) to meet the design criteria of a particular application.

The modulator 102 generally comprises the resistor R1, the diode D1, and the capacitance C1. A first terminal of the resistance R1 may receive the signal DATA_IN. The resistance R1 may have a second terminal that may be connected to a first terminal of the capacitance C1 and a first terminal (e.g., an anode terminal) of the diode D1. The diode D1 may have a second terminal (e.g., a cathode terminal) that may be connected to the node 120. The capacitance C1 may have a second terminal that may be connected to the node 118. The signal MOD is generally presented at the node 118.

The generator 104 generally comprises the capacitances C2, C3, C4 and C5, the resistors R2, R3, R4, R5 and R6, the inductance L1, the device X1, and the transistor Q1 configured in combination to form a Colpitts oscillator. However, the generator 104 may be implemented as any appropriate oscillator configuration to meet the design criteria of a particular application. Furthermore, some components (e.g., the capacitance C2 and the resistor R6) may be considered components of the modulator 102 as well as the generator 104.

The capacitance C2 may have a first terminal that may be connected to the node 118 and a second terminal that may be connected to a first terminal of the resistor R6. The capacitance C3 may have a first terminal that may be connected to the node 116 and a second terminal that may be connected to the node 118. The capacitance C4 may have a first terminal that may be connected to the node 114 and a second terminal that may be connected to the node 116. The capacitance C5 may have a first terminal that may be connected to the node 110 and a second terminal that may be connected to the node 114.

The resistor R2 may have a first terminal that may be connected to the node 110 and a second terminal that may be connected to the node 112. The resistor R3 may have a first terminal that may be connected to the node 112 and a second terminal that may be connected to the node 114. The resistor R4 may have a first terminal that may be connected to the node 114 and a second terminal that may be connected to the node 116. The resistor R5 may have a first terminal that may be connected to the node 114 and a second terminal that may be connected to the node 120. The resistor R6 may have a second terminal that may be connected to the node 120. The signal OUTPUT is generally presented at the node 120.

The inductance L1 may have a first terminal that may be connected to the node 110 and a second terminal that may be connected to the node 118. The device X1 may have a first terminal that may be connected to the node 112 and a second terminal that may be connected to the node 114. The transistor Q1 may have a base that may be connected to the node 112, an emitter that may be connected to the node 116, and a collector that may be connected to the node 118 (e.g., a collector that may receive the signal MOD).

During one mode of operation of the oscillator 100 (e.g., an AM transmission, broadcast, or radiation mode), the signal DATA_IN is generally configured to control the amplitude modulation of the signal OUTPUT (i.e., amplitude modulation of the envelope of the signal OUTPUT). When the signal DATA_IN changes, current flow through the diode D1 generally changes and the effective parallel capacitance of the capacitances C1 and C2 changes accordingly. The signal MOD is generally adjusted in response to the signal DATA_IN. Since the device X1 generally sets (i.e., provides, fixes, establishes, generates, etc.) the RF carrier frequency of the signal OUTPUT, the signal MOD generally provides amplitude modulation to the envelope of the signal OUTPUT as determined by the signal DATA_IN.

The carrier frequency of the signal OUTPUT is generally a fixed RF frequency. The oscillator 100 generally provides any desired level (or percentage) of amplitude modulation (e.g., from 0% to 100%) to the envelope of the signal OUTPUT as compared with typical conventional AM oscillator approaches that are implemented in connection with TPM or RKE systems that only implement on-off keyed (OOK) (i.e., only 0% and 100% or another fixed value percentage) modulation. Since the modulation is implemented via the diode D1, the oscillator 100 may be suitable for much faster data rates than typical conventional AM oscillator approaches.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. For use in a tire pressure monitoring system, an amplitude modulation (AM) radio frequency (RF) oscillator comprising:
   a modulator comprising a diode configured to generate a modulation signal in response to a data input signal; and
   a generator configured to generate an AM output signal having an RF carrier frequency and an envelope, wherein the envelope is amplitude modulated by the modulation signal and the generator comprises a frequency determining device that includes a surface acoustic wave (SAW) device.

2. The oscillator of claim 1 wherein the oscillator comprises a Colpitts oscillator.

3. The oscillator of claim 1 wherein the frequency determining device further comprises a crystal resonator or a ceramic resonator.

4. The oscillator of claim 1 wherein the oscillator is implemented for use in a remote keyless entry (RKE) system.

5. The oscillator of claim 1 wherein the generator comprises a single transistor.

6. For use in a tire pressure monitoring system, a method of generating an amplitude modulation (AM) radio frequency (RF) output signal, the method comprising:
   generating a modulation signal in response to a data input signal using a diode;
   generating an AM output signal having a carrier frequency and an envelope; and
   amplitude modulating the envelope of the output signal with the modulation signal, wherein the output signal is generated using a generator comprising a frequency determining device that includes a surface acoustic wave (SAW) device.

7. The oscillator of claim 6 wherein the output signal is generated using a Colpitts oscillator.

8. The method of claim 6 wherein the frequency determining device further comprises a crystal resonator or a ceramic resonator.

9. The method of claim 6 wherein the method is implemented for use in a remote keyless entry (RKE) system.

10. The method of claim 6 comprising generating the output signal using a single transistor.

11. For use in a remote keyless entry (RKE) system, an amplitude modulation (AM) radio frequency (RF) oscillator comprising:
    a modulator comprising a diode configured to generate a modulation signal in response to a data input signal; and
    a generator configured to generate an AM output signal having an RF carrier frequency and an envelope, wherein the envelope is amplitude modulated by the modulation signal and the generator comprises a surface acoustic wave (SAW) device.

12. The oscillator of claim 11 wherein the SAW is configured to generate the carrier frequency and receive the modulation signal.

13. The oscillator of claim 11 wherein the oscillator comprises a Colpitts oscillator.

14. The oscillator of claim 11 wherein the oscillator is coupled to an amplifier or an antenna.

15. The oscillator of claim 11 wherein the generator comprises a single transistor.

* * * * *